(12) United States Patent
Schlezinger (10) Patent No.: US 11,050,421 B2
(45) Date of Patent: Jun. 29, 2021

(54) ELECTRICAL ASSEMBLY

(71) Applicant: GENERAL ELECTRIC TECHNOLOGY GMBH, Baden (CH)

(72) Inventor: Cristian Schlezinger, Stafford (GB)

(73) Assignee: General Electric Technology GmbH, Baden (CH)

( * ) Notice: Subject to any disclaimer, the term of this patent is extended or adjusted under 35 U.S.C. 154(b) by 81 days.

(21) Appl. No.: 16/342,252

(22) PCT Filed: Oct. 16, 2017

(86) PCT No.: PCT/EP2017/076324
§ 371 (c)(1),
(2) Date: Apr. 16, 2019

(87) PCT Pub. No.: WO2018/073164
PCT Pub. Date: Apr. 26, 2018

(65) Prior Publication Data
US 2019/0326907 A1 Oct. 24, 2019

(30) Foreign Application Priority Data
Oct. 21, 2016 (EP) .................................... 16195084

(51) Int. Cl.
| H03K 17/95 | (2006.01) |
| G01B 7/00 | (2006.01) |
| G01D 5/20 | (2006.01) |
| G01R 31/28 | (2006.01) |
| H01F 7/18 | (2006.01) |
| H01H 47/00 | (2006.01) |

(Continued)

(52) U.S. Cl.
CPC ........... H03K 17/952 (2013.01); G01B 7/003 (2013.01); G01D 5/2013 (2013.01);
(Continued)

(58) Field of Classification Search
CPC ........... G01D 5/2013; H01H 2047/009; H01H 47/002; H01H 51/10; H01H 47/22;
(Continued)

(56) References Cited

U.S. PATENT DOCUMENTS 5,053,911 A * 10/1991 Kopec ................ G01R 31/2829
361/154
5,774,323 A * 6/1998 Innes .................... H01H 47/002
361/187

(Continued)

OTHER PUBLICATIONS

European Search Report and Written Opinion dated Apr. 10, 2017 which was issued in connection with Ep 16195084.5 which was filed on Oct. 21, 2016.

(Continued)

*Primary Examiner* — Carlos Amaya
*Assistant Examiner* — Esayas G Yeshaw
(74) *Attorney, Agent, or Firm* — Eversheds Sutherland (US) LLP (57) ABSTRACT

An electrical assembly comprises a device. The device includes an inductive coil and an armature. The armature is arranged to be moveable between first and second positions when the inductive coil is energized. The electrical assembly further includes a detection unit which is configured to detect an inductance of the inductive coil or a characteristic that corresponds to the inductance of the inductive coil. The detection unit is further configured to determine the position of the armature based on the detected inductance or the detected characteristic.

12 Claims, 2 Drawing Sheets

(51) Int. Cl.
*H01H 47/22* (2006.01)
*H01H 51/10* (2006.01)

(52) U.S. Cl.
CPC ....... *G01R 31/2829* (2013.01); *H01F 7/1844* (2013.01); *H01H 47/002* (2013.01); *H01H 47/22* (2013.01); *H01H 51/10* (2013.01); *H01F 2007/185* (2013.01); *H01H 2047/009* (2013.01)

(58) Field of Classification Search
CPC ............... G01R 31/2829; H01F 7/1844; H01F 2007/185; G01B 7/003; H03K 17/952
See application file for complete search history.

(56) References Cited

U.S. PATENT DOCUMENTS

| | | | | |
|---|---|---|---|---|
| 6,023,110 A * | 2/2000 | Henrion | ............... | H01H 47/004 307/125 |
| 2009/0316324 A1 * | 12/2009 | Scripca | .................. | A01G 25/16 361/160 |
| 2011/0149458 A1 * | 6/2011 | Thomas | ................ | H01F 7/1844 361/160 |
| 2014/0111891 A1 * | 4/2014 | Ward | ................... | H01H 47/043 361/42 |
| 2015/0167861 A1 * | 6/2015 | Ferrer Herrera | ....... | A01G 25/16 239/73 |
| 2016/0125993 A1 * | 5/2016 | Narayanasamy | .... | G01D 5/2006 361/160 |
| 2018/0166244 A1 * | 6/2018 | Kobayashi | ........... | H01H 50/645 |

OTHER PUBLICATIONS nternational Search Report and Written Opinion dated Nov. 9, 2017 which was issued in connection with PCT/EP2017/076324 which was filed on Oct. 16, 2017.

* cited by examiner

ELECTRICAL ASSEMBLY

BACKGROUND OF THE DISCLOSURE

This disclosure relates to an electrical assembly and to a method of determining the position of an armature of a device.

It is known to use a device that includes an inductive coil and an armature to selectively move the armature between first and second positions. Such a device may be used to selectively open and close an electrical circuit.

BRIEF SUMMARY

According to a first aspect there is provided an electrical assembly comprising:

a. a device including an inductive coil and an armature, the armature arranged to be moveable between first and second positions when the inductive coil is energised; and b. a detection unit configured to detect an inductance of the inductive coil or a characteristic that corresponds to the inductance of the inductive coil, the detection unit further configured to determine the position of the armature based on the detected inductance or the detected characteristic.

It will be understood that the invention is applicable to electrical assemblies with an armature arranged to be moveable between two or more positions when the inductive coil is energised, i.e. the armature is not limited to being moveable between only first and second positions. For example, the armature may be arranged to be moveable between a first position, a second position and at least one other position when the inductive coil is energised.

The ability to confirm the mechanical position of an armature permits the invention to provide information on the state of the device. This is particularly useful when the device is a switching device being used to implement a tripping or signalling output in an electrical circuit.

Having a detection unit which is configured to detect an inductance of the inductive coil or a characteristic that corresponds to the inductance of the inductive coil, and determine the position of the armature based on the detected inductance or the detected characteristic provides a reliable and cost effective way of confirming the position of the armature.

The inductance of the inductive coil is influenced by the position of the armature since the armature affects the magnetic circuit of the coil. As such, detecting the inductance of the inductive coil or a characteristic that corresponds to the inductance of the inductive coil permits the position of the armature to be determined.

Detecting an inductance of the inductive coil means that the inductance of the inductive coil is directly obtained. Detecting a characteristic that corresponds to the inductance of the inductive coil means that a value that corresponds to the inductance of the inductive coil, e.g. current, time, rate of change of current, rate of change of voltage or voltage, is obtained.

The device may be a switching device, such as a relay, a circuit breaker or any other type of switching device which includes an inductive coil and a moveable armature. The device may instead be an electromechanical actuator, a trip coil solenoid or any other type of non-switching device which includes an inductive coil and a moveable armature.

In contrast to the invention, the position of an armature of a device may be monitored by including auxiliary contacts in the device that move with the armature and whose positions are separately monitored to provide the position of the armature. Such an arrangement makes the device more complex and thus more expensive.

Also, when a switching device with such auxiliary contacts is used in an electrical circuit that relies on the isolation provided by the device (e.g. a relay device), the construction of the switching device has to be such that the auxiliary contacts provide the required isolation between them and the main switching contacts of the electrical circuit. In general, the contact rating of a multi-contact relay device is lower than the contact rating of a single contact relay device for the same form factor. As such, a switching device that includes auxiliary contacts will have a lower contact rating than the switching device which does not require auxiliary contacts to determine the position of the armature. Furthermore in standard relay devices the isolation level between contacts is much lower than between the contacts and the inductive coil. Therefore using auxiliary contacts to monitor the position of the armature would reduce the current carrying capability of the switching device because one of the contacts will be used for position monitoring, and also the dielectric withstand rating will be affected because of the reduced dielectric withstand between the contacts.

The electrical assembly further includes a control unit configured to selectively control a voltage across the inductive coil so as to apply a voltage step to the inductive coil, wherein the detection unit is configured to detect the inductance of the inductive coil or the characteristic that corresponds to the inductance of the inductive coil in response to the voltage step applied to the inductive coil by the control unit.

Providing such a control unit allows a controlled amount of voltage step to be applied to the inductive coil. Applying a voltage step to the inductive coil results in a step change in the voltage across the inductive coil which causes a gradual change in current of the inductive coil. Since there exists a relationship between current and inductance, the inductance of the inductive coil can be detected, and thereafter the position of the armature can be determined.

The voltage step may be a positive voltage step or a negative voltage step, i.e. it may add or remove to the voltage across the inductive coil.

When the detection unit is configured to detect a characteristic that corresponds to the inductance of the inductive coil, the detection unit may be configured to monitor a rate of change of current of the inductive coil when the voltage step is applied to the inductive coil.

Such an arrangement utilises the existing relationship between the inductance of the inductive coil and the rate of change of current of the inductive coil to permit the position of the armature to be determined.

One way of monitoring the rate of change of current of the inductive coil is to monitor a time interval for the current of the inductive coil to reach a threshold current value after the voltage step has been applied to the inductive coil. The threshold current value may be a predetermined value, or it may be a steady state current value. The current of the inductive coil may be measured by measuring the voltage across a resistor through which the current of the inductive coil passes.

Alternatively, the rate of change of current of the inductive coil may be monitored by monitoring a time interval for the voltage across a resistor through which the current of the inductive coil passes to reach a threshold voltage value after the voltage step has been applied to the inductive coil. The threshold voltage value may be a predetermined value, or it may be a steady state voltage value.

Another way to monitor the rate of change of current of the inductive coil is to monitor the current of the inductive coil for a predetermined time interval after the voltage step has been applied to the inductive coil. The current of the inductive coil may be measured by measuring the voltage across a resistor through which the current of the inductive coil passes.

Optionally the control unit is configured to control the magnitude of the voltage step applied to the inductive coil so that the voltage across the inductive coil is controlled at a value that maintains the position of the armature.

As such, the position of the armature can be determined without moving or changing the position of the armature. The state of the device is therefore unchanged, when the device is a switching device being used to implement a tripping or signalling output in an electrical circuit.

Furthermore, the determined position of the armature would accurately reflect the present position of the armature.

The magnitude of the voltage step applied to the inductive coil may be controlled so that the voltage across the inductive coil is controlled at a value lower than the voltage required to move the armature between the first and second positions.

The magnitude of the voltage step applied to the inductive coil may instead be controlled so that the voltage across the inductive coil is controlled at a value equal to or higher than the voltage required to move the armature between the first and second positions, wherein the control unit is configured to control the voltage across the inductive coil so as to apply the voltage step to the inductive coil for an amount of time less than the time required to move the armature between the first and second positions at that value.

Optionally the detection unit is configured to compare the detected inductance or detected characteristic with a respective reference inductance threshold or reference characteristic threshold to determine the position of the armature.

The reference inductance or reference characteristic threshold is pre-set to be indicative of the armature being in a certain position. Therefore comparing the detected inductance or the detected characteristic to such a reference threshold provides an effective way of determining the position of the armature.

The reference inductance or reference characteristic threshold may be a reference inductance or reference characteristic value, or it may instead be a reference inductance or reference characteristic range.

The electrical assembly further includes a calibration unit configured to carry out a calibration of the device so as to determine the reference inductance or reference characteristic threshold.

Such an arrangement permits the reference inductance or reference characteristic threshold to be pre-set based on the electrical assembly's characteristics.

The calibration unit may be configured to determine a first reference inductance or reference characteristic threshold indicative of the armature being in the first position, and/or a second reference inductance or reference characteristic threshold indicative of the armature being in the second position.

Accordingly, comparing the detected inductance or detected characteristic to either or both of the first and second reference inductance or reference characteristic thresholds permits the determination of the position of the armature.

When the calibration unit is configured to determine the first and second reference inductance or reference characteristic thresholds, the calibration unit may be configured to determine a third reference inductance or reference characteristic threshold that is a value between the first and second reference inductance or reference characteristic thresholds, wherein the third reference inductance or reference characteristic threshold is an average of the first and second reference inductance or reference characteristic thresholds.

Such a third reference threshold permits the determination of the position of the armature based on a single reference threshold.

The calibration unit may instead be configured to determine a fourth reference inductance or reference characteristic threshold indicative of the armature being part-way between the first and second positions, wherein the fourth reference inductance or reference characteristic threshold is indicative of the armature being half-way between the first and second positions.

Such a fourth reference threshold also permits the determination of the position of the armature based on a single reference threshold.

Optionally, the reference inductance or reference characteristic threshold may be predetermined, and may be stored and/or hardcoded into the device.

As such, the reference inductance or reference characteristic threshold is determined externally to the electrical assembly. The device therefore comes pre-loaded with the desired reference threshold, thus potentially saving time and reducing the complexity of the electrical assembly.

The device may be a latching relay, the latching relay being configured to selectively hold the position of the armature when the inductive coil is de-energised.

Since the latching relay is configured to selectively hold the armature in position when the inductive coil is de-energised, the inductive coil need only to be energised for a short period of time to move and hold the armature in a desired position.

In particular, the latching relay is configured to latch, i.e. hold, the armature in the last position of the armature. The latching relay may be capable of latching, i.e. holding, the armature in either of the first and second positions, or in only one of the first and second positions.

It can detect the inductance of the inductive coil when the inductive coil is de-energised, and so there is ample opportunity to determine the position of the armature of the latching relay since it is only energised for a short period of time during its operation.

The device may instead be a non-latching relay.

According to a second aspect there is provided a method of determining the position of an armature of a device, the device further including an inductive coil, and the armature being arranged to be moveable between first and second positions when the inductive coil is energised, the method comprising:

detecting an inductance of the inductive coil or a characteristic that corresponds to the inductance of the inductive coil; and determining the position of the armature based on the detected inductance or the detected characteristic.

The electrical assembly of the first aspect and its embodiments apply mutatis mutandis to the method of the second aspect and its embodiments.

The method further includes:

i) controlling a voltage across the inductive coil so as to apply a voltage step to the inductive coil; and ii) detecting the inductance of the inductive coil or the characteristic that corresponds to the inductance of the inductive coil in response to the voltage step applied to the inductive coil.

Optionally detecting the characteristic that corresponds to the inductance of the inductive coil includes:

i) monitoring a rate of change of current of the inductive coil when the voltage step is applied to the inductive coil.

In some embodiments controlling a voltage across the inductive coil may include controlling the magnitude of the voltage step applied to the inductive coil so that the voltage across the inductive coil is controlled at a value that maintains the position of the armature.

Controlling a voltage across the inductive coil includes controlling the magnitude of the voltage step applied to the inductive coil so that the voltage across the inductive coil is controlled at a value lower than the voltage required to move the armature between the first and second positions.

Alternatively controlling a voltage across the inductive coil includes:

controlling the magnitude of the voltage step applied to the inductive coil so that the voltage across the inductive coil is controlled at a value equal to or higher than the voltage required to move the armature between the first and second positions; and controlling the voltage across the inductive coil so as to apply the voltage step to the inductive coil for an amount of time less than the time required to move the armature between the first and second positions at that value.

Determining the position of the armature based on the detected inductance or detected characteristic includes comparing the detected inductance or detected characteristic with a respective reference inductance threshold or a reference characteristic threshold to determine the position of the armature.

In some embodiments, the method may further include carrying out a calibration of the device so as to determine the reference inductance or reference characteristic threshold.

Optionally carrying out a calibration includes determining a first reference inductance or reference characteristic threshold indicative of the armature being in the first position, and/or a second reference inductance or reference characteristic threshold indicative or the armature being in the second position.

When the method includes determining the first and second reference inductance or reference characteristic thresholds, the method may further include determining a third reference inductance or reference characteristic threshold that is a value between the first and second reference inductance or reference characteristic thresholds, wherein the third reference inductance or reference characteristic threshold is an average of the first and second reference inductance or reference characteristic thresholds.

When the method includes determining the first and second reference inductance or reference characteristic thresholds, the method may further include determining a fourth reference inductance or reference characteristic threshold indicative of the armature being part-way between the first and second positions, wherein the fourth reference inductance or reference characteristic threshold is indicative of the armature being half-way between the first and second positions.

Alternatively, the method may include providing a device wherein the reference inductance or reference characteristic threshold is predetermined, and is stored and/or hardcoded into the device.

In some embodiments, the method may include providing a device that is a latching relay, the latching relay being configured to selectively hold the position of the armature when the inductive coil is de-energised.

In other embodiments, the method may instead include providing a device that is a non-latching relay.

BRIEF DESCRIPTION OF THE DRAWINGS

An embodiment will now be described, by way of a non-limiting example, with reference to the accompanying drawings in which.

DETAILED DESCRIPTION

Figure 1:
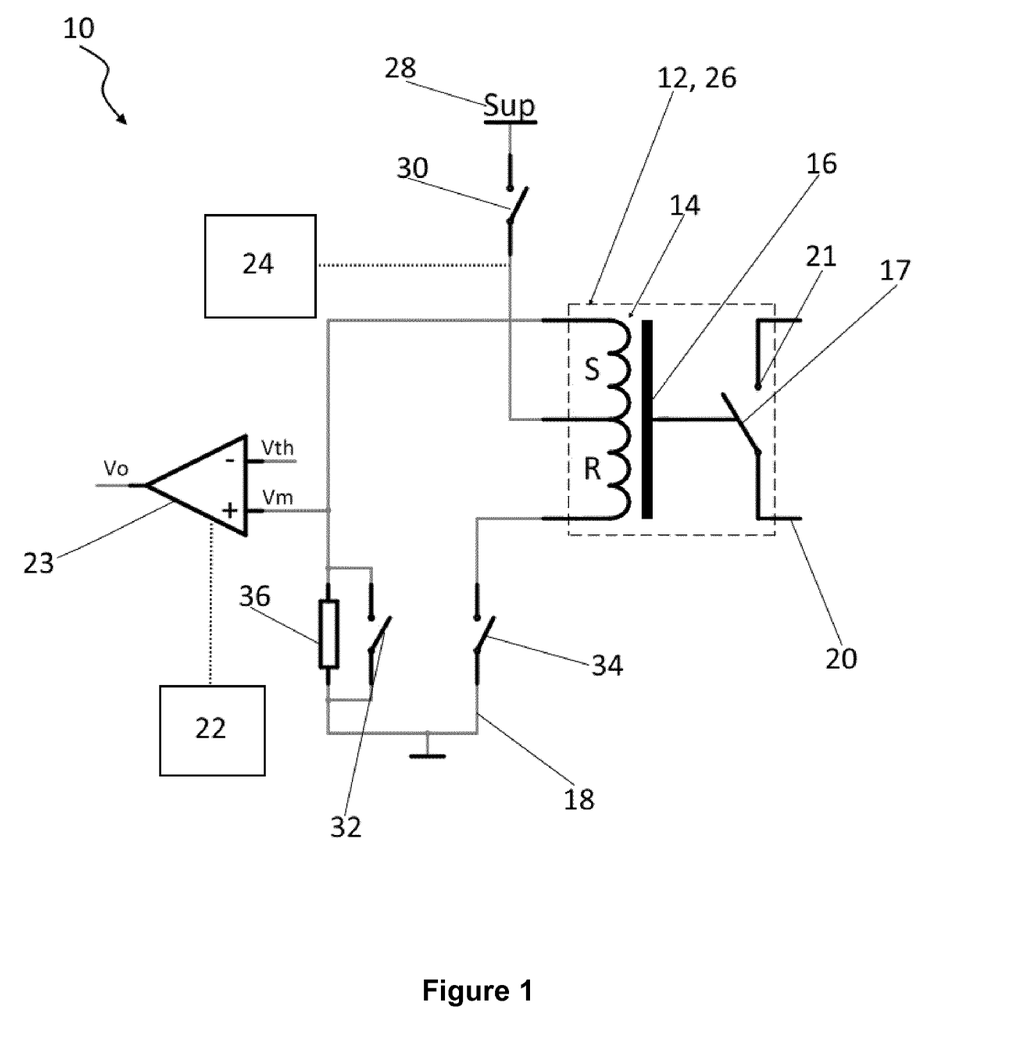
FIG. 1 shows a schematic view of an electrical assembly according to an embodiment with an armature in the first position.
Figure 2:
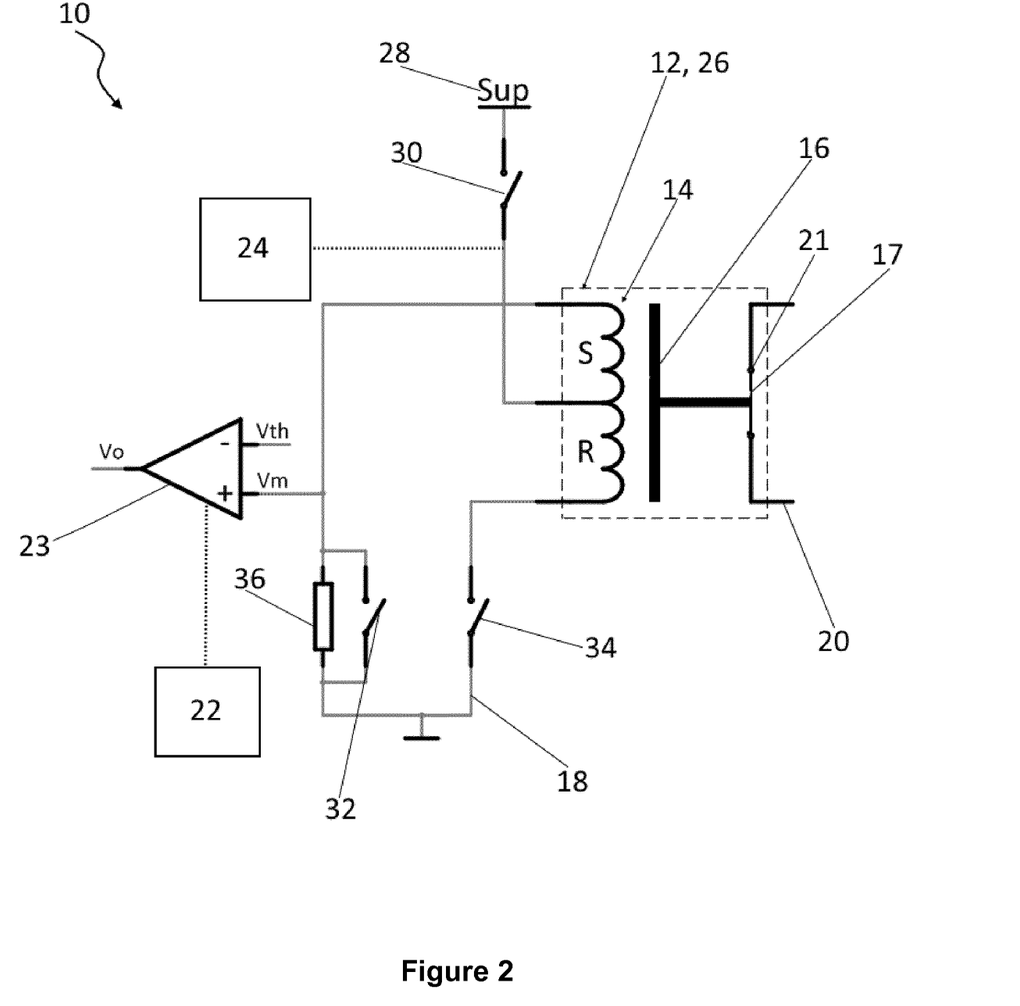
FIG. 2 shows a schematic view of the electrical assembly shown in FIG. 1 with the armature in the second position.

An electrical assembly according to a first embodiment is shown in FIGS. 1 and 2 and is designated generally by the reference numeral 10.

The electrical assembly 10 includes a device in the form of a switching device 12. As such, the electrical assembly 10 is a switching assembly 10 in the embodiment shown. In other embodiments, the device may instead be a non-switching device, such as an electromechanical actuator or a trip coil solenoid.

The switching device 12 includes an inductive coil 14 and an armature 16. The armature 16 is arranged to be moveable between first and second positions when the inductive coil 14 is energised.

The armature 16 includes a moveable contact 17 which is moveable with the armature 16 between the first and second positions. In the embodiment shown, the moveable contact 17 is mechanically linked to the armature 16 e.g. via a pivot. In other embodiments, the moveable contact 17 may not be mechanically linked to the armature 16 and may instead be mechanically linked to another part of the switching assembly 10 which permits movement of the moveable contact 17 when the armature 16 abuts the moveable contact 17.

In still other embodiments, the armature 16 may be integrally formed with the moveable contact 17.

The inductive coil 14 forms part of an input circuit 18, and the armature 16 (in particular the moveable contact 17) forms part of an output circuit 20. In the embodiment shown, the input circuit 18 operates at a lower current than the output circuit 20. In other embodiments the output circuit 20 may instead operate at a lower or the same current as the input circuit 18. In further other embodiments the inductive coil 14 forms part of an output circuit while the armature 16 (in particular, the moveable contact 17) forms part of an input circuit.

FIG. 1 shows the armature 16 in the first position wherein the armature 16 has moved the moveable contact 17 to an open position relative to a fixed contact 21 of the output circuit 20 such that current is prevented from flowing through the output circuit 20.

FIG. 2 shows the armature 16 in the second position wherein the armature 16 has moved the moveable contact 17 to a closed position relative to the fixed contact 21 of the output circuit 20 such that current is permitted to flow through the output circuit 20.

The switching device 12 may be a "normally open" device wherein the armature 16 is in the first position as default. In other embodiments however the switching device 12 may instead be a "normally closed" device wherein the armature 16 is in the second position by default. The switching device 12 may include a biasing member (not shown), such as a spring, to bias the armature 16 to the first or second positions.

The switching assembly 10 further includes a detection unit 22 which is configured to detect an inductance of the inductive coil 14 or a characteristic that corresponds to an inductance of the inductive coil 14. The detection unit 22 is further configured to determine the position of the armature 16 based on the detected inductance or detected characteristic.

The switching assembly 10 further still includes a control unit 24 which is configured to control the voltage across the inductive coil 14 so as to apply a voltage step to the inductive coil 14.

In particular, the control unit 24 is configured to control the magnitude of the voltage step so that the voltage across the inductive coil 14 is controlled at a value that maintains the position of the armature 16, i.e. it does not cause movement of the armature 16.

The magnitude of the voltage step applied to the inductive coil 14 may be controlled so that the voltage across the inductive coil 14 is controlled at a value lower than the voltage required to move the armature 16 between the first and second positions. Alternatively, the magnitude of the voltage step applied to the inductive coil 14 may be controlled so that the voltage across the inductive coil 14 is controlled at a value equal to or higher than the voltage required to move the armature 16 but is applied to the inductive coil 14 for an amount of time that is not long enough to influence the position of the armature 16 at that value.

In a particular example wherein the switching device 12 requires a current flow through the inductive coil 14 to keep the armature 16 in position, e.g. such as a non-latching relay, a voltage step lower than the voltage required to move the armature 16 could be applied while the inductive coil 14 is de-energised (i.e. while there is no current flow through the inductive coil 14). Another option for this type of switching device 12, e.g. a non-latching relay, would be to apply a nominal voltage step but for a very short duration with respect to the mechanical inertia of the switching device 12 such that the mechanical inertia of the armature 16 will not allow the armature 16 to move. The nominal voltage could then be applied while the inductive coil 14 is either energised or de-energised.

In the latter regard, when the voltage step is being applied while the inductive coil 14 is energised, i.e. while there is a current flow through the inductive coil 14, the voltage step could be applied in several ways such that the voltage across the inductive coil 14 is increased (e.g. doubled), thus increasing the force on the armature 16 being held in the current position. Alternatively, the voltage step could be applied for a short period of time. Any other type of voltage step pattern can be applied which does not move the armature 16 out of position.

In a particular example wherein the switching device 12 does not require a current flow through the inductive coil 14 to keep the armature 16 in position, e.g. such as a latching relay, depending on the number of inductive coils 14 or the switching pattern required to move the armature 16 to the desired state, the same techniques as described above can be implemented.

The detection unit 22 is configured to detect the inductance of the inductive coil 14 or a characteristic that corresponds to the inductance of the inductive coil 14 in response to the voltage step being applied to the inductive coil 14 by the control unit 24.

In the embodiment shown, the detection unit 22 is configured to detect a characteristic that corresponds to the inductance of the inductive coil 14. In particular, the detection unit 22 is configured to monitor a rate of change of current of the inductive coil 14 when the voltage step is applied to the inductive coil 14. The detection unit 22 may instead be configured to directly detect the inductance of the inductive coil 14.

The relationship between the inductance of an electrical circuit, the current through the circuit and the voltage across the circuit is shown below:

$$v(t) = L\frac{di}{dt}$$

Such a relationship can be utilised when applying the voltage step v(t) to the inductive coil and monitoring the rate of change of current $$\frac{di}{dt}$$

of the inductive coil 14 to detect the inductance L of the inductive coil 14.

The detection unit 22 includes a sensor unit which senses the current of the inductive coil 14. The sensor unit in the embodiment shown is part of a voltage comparator unit 23, which not only senses the current of the inductive coil 14 via a voltage measurement, but also compares the voltage measurement to a voltage threshold. The voltage comparator unit 23 may instead be a current comparator which directly measures the current of the inductive coil 14 and compares it with a current threshold. The voltage comparator 23 may instead be an inductance comparator which directly measures the inductance of the inductive coil 14 and compares it with an inductance threshold.

The detecting unit 22 also includes a timing unit (not shown) which detects a time interval for the current of the inductive coil 14 to reach a current threshold when the voltage step is applied. The current threshold may be a final steady state current value or may instead be a predetermined current threshold.

The voltage comparator unit 23 forms part of a higher-level comparator (not shown) which is configured to compare the detected characteristic with a reference characteristic threshold. In the embodiment shown, the detected characteristic is compared with a reference characteristic value. In other embodiments, the detected characteristic may be compared with a reference characteristic range.

The detected characteristic may be a rate of change of current across the inductive coil 14 which is compared to a reference rate of change of current value. The detected characteristic may instead be a rate of change of voltage across the inductive coil 14 which is compared to a reference rate of change of voltage value.

The detected characteristic may instead be a time interval for the current (or voltage) across the inductive coil 14 to reach the threshold current (or voltage) value which is then compared to a reference time interval value.

Alternatively, the timing unit may set a fixed time for the current of the inductive coil 14 to be measured by the sensor unit. The current, or rate of change of current, after the fixed time may then be compared to a reference current, or rate of change of current, value so as to determine the position of the armature 16.

To obtain the reference characteristic value to which the detected characteristic is compared, the switching assembly 10 includes a calibration unit (not shown) which performs a self-calibration of the switching assembly 10 by measuring the characteristic that corresponds to the inductance of the inductive coil 14 with the armature 16 in the first and second positions (or any other possible positions of the armature 16). The switching assembly 10 may include a self-calibration circuit (not shown) with software which will command the switching device 12 to move the armature 16 to one of the first and second positions and then measure the inductance (or a characteristic thereof) in each of the positions. A reference characteristic value will then be computed by the calibration unit. Once the reference characteristic value is computed by the calibration unit, that reference characteristic value will be used to decide the position of the armature 16 by comparing the detected characteristic with the reference characteristic value.

In an alternative embodiment, the reference characteristic value is determined externally to the switching assembly 10 and is instead stored and/or hardcoded into the switching device 12.

The switching device 12 in the embodiment shown is an electromechanical relay, in particular a latching relay 26 which is configured to selectively hold the armature 16 in position when the inductive coil 14 is de-energised. The latching relay 26 may also be known in the art as an "impulse", "keep" or "stay" relay.

How a latching relay 26 holds an armature 16 in position is known in the art. For example, the latching relay 26 may include two opposing inductive coils 14 with an over-centre spring or permanent magnet to hold the armature 16 in position after the inductive coil 14 is de-energised, wherein a pulse to one inductive coil 14 moves the armature 16 to the first position and a pulse to the opposite inductive coil 14 moves the armature 16 to the second position.

The detection unit 22 is configured to detect the characteristic that corresponds to the inductance of the inductive coil 14 when the inductive coil 14 is de-energised. In other embodiments, for example in embodiments where the switching device 12 is a non-latching relay, the characteristic that corresponds to the inductance of the inductive coil 14 may be detected when the inductive coil 14 is energised.

Returning to the embodiment shown in the figures, the latching relay 26 includes first and second independent inductive coils S, R. The first coil S is known as a "set coil" and the second coil is known as a "reset coil".

The input circuit 18 is connected to the first and second inductive coils S, R such that a current can be separately supplied to the first and second inductive coils S, R so as to separately energise the inductive coils S, R, and thus move the armature 16 to one of the first and second positions.

In particular, the input circuit 18 includes a supply 28 which is connected into and out of the input circuit 18 via a supply switching element 30. The input circuit 18 also includes a first coil switching element 32 and a second coil switching element 34. To energise the first inductive coil S, both the supply switching element 30 and the first coil switching element 32 must be closed while the second coil switching element 34 is open. To energise the second inductive coil R, both the supply switching element 30 and the second coil switching element 34 must be closed while the first coil switching element 32 is open.

Switching of the supply switching element 30 and the first and second coil switching elements 32, 34 is controlled by the control unit 24.

The input circuit 18 further includes a resistive element 36 which is connected in parallel with the first coil switching element 32. The resistive element 36 permits the detecting unit 22 to sense the current of the first inductive coil S since it permits the voltage across the resistive element 36 to be measured, which is proportional to the current of the first inductive coil S.

The detection unit 22 and the control unit 24 may form part of the same unit or may instead be separate units.

In other embodiments, the switching device 12 may be a type of relay other than a latching relay 26 and may include a fewer or higher number of inductive coils 14. In further embodiments, the switching device 12 may not be a relay and may instead be a circuit breaker or any other type of device which includes an inductive coil 14 and a moveable armature 16.

The switching device 12 may further include one or more magnetic cores (not shown) around which a respective inductive coil 14 is wrapped. The or each magnetic core may be a piece of ferromagnetic material such as iron.

To move the armature 16 from the first position (FIG. 1) to the second position (FIG. 2), the control unit 24 closes both the supply switching element 30 and the first inductive coil switching element 32 for a predetermined amount of time to permit a current to flow through the first inductive coil S so as to energise the first inductive coil S enough to move the armature 16. The armature 16 is moved by the energised first inductive coil S from the first position by which the moveable contact 17 is in an open position relative to the output circuit 20 (i.e. the "reset position") to the second position by which the moveable contact 17 is in a closed position relative to the output circuit 20 (i.e. the "set position").

The control unit 24 then opens the supply switching element 30 and the first inductive coil switching element 32, thus ceasing the current flow through the first inductive coil S which de-energises the first inductive coil S.

Since the switching device 12 shown is a latching relay 26, the armature 16 is held in the second position (i.e. the last position of the armature 16) while the first inductive coil S is de-energised. In other types of relay devices, such a non-latching relay, the armature 16 may automatically move back to the first position once the first inductive coil S is de-energised, e.g. because the armature 16 is biased to the first position. The armature 16 may instead stay in the second position, e.g. because the armature 16 is biased to the second position.

To move the armature 16 from the second position (FIG. 2) back to the first position (FIG. 1), the control unit 24 closes both the supply switching element 30 and the second inductive coil switching element 34 for a predetermined amount of time to permit a current to flow through the second inductive coil R so as to energise the second inductive coil R enough to move the armature 16. The armature 16 is moved by the energised second inductive coil R from the second position to the first position.

The control unit 24 then opens the supply switching element 30 and the second inductive coil switching element 34, thus ceasing the current flow through the second inductive coil R which de-energises the second inductive coil R.

Again, since the switching device 12 shown is a latching relay 26, the armature 16 is held in the first position (i.e. the last position of the armature 16) while the second inductive coil R is de-energised.

In order to detect the position of the armature 16, the control unit 24 is implemented to apply the voltage step to the first inductive coil S. The voltage step does not influence the present position of the armature 16. This might be achieved by the voltage step being kept lower than the voltage required to move the armature 16 between the first and second positions, or by the voltage step being applied for an amount of time that does not permit the armature 16 to move between the first and second positions.

In the embodiment shown, the voltage step is applied by the control unit 24 closing the supply switching element 30 so that current starts to flow through the first inductive coil S and the resistive element 36. As the current flow builds up the voltage $V_m$ across the resistive element 36 also increases.

When the supply switching element 30 is closed, the timing unit activates.

The comparator unit 23, which in this embodiment is a voltage comparator, compares the voltage $V_m$ across the resistive element 36 to a voltage threshold $V_{th}$. When the voltage $V_m$ across the resistive element 36 reaches the voltage threshold $V_{th}$, the comparator unit 23 will output a toggle, e.g. it will output a high digital signal $V_o$.

The timing unit deactivates once the comparator unit 23 outputs the digital signal, i.e. it stops timing. Thus a time interval for the voltage $V_m$ across the resistive element 36 to reach the voltage threshold $V_{th}$ is obtained.

The amount of time it takes for the voltage $V_m$ across the resistive element 36 to reach the voltage threshold $V_{th}$ is dependent on the time it takes for the current to build up across the first inductive coil S, which in turn is dependent on the inductance of the first inductive coil S. In this way, a characteristic that corresponds to the inductance of the first inductive coil S is detected.

The detection unit 22 then compares the time interval obtained by the timing unit (i.e. the detected characteristic) to a reference time interval value (i.e. the reference characteristic threshold—which in this case is a value) to determine the position of the armature 16.

The voltage threshold $V_{th}$ may be a final steady state voltage value. The voltage threshold $V_{th}$ may instead be another voltage which is pre-measured and indicative of the armature 16 being in a particular position.

In other embodiments, the detection unit 22 may instead calculate the rate of change of current during the time interval and then compare the rate of change of current (i.e. the detected characteristic) to a rate of change of current reference value (i.e. the reference characteristic threshold) to determine the position of the armature 16.

In further embodiments, the detection unit 22 may instead calculate the rate of change of voltage during the time interval and then compare the rate of change of voltage (i.e. the detected characteristic) to a rate of change of voltage reference value (i.e. the reference characteristic threshold) to determine the position of the armature 16.

In further still embodiments, the detection unit 22 may instead measure the current during the time interval and then compare the measured current (i.e. the detected characteristic) to a current reference value (i.e. the reference characteristic threshold) to determine the position of the armature 16.

In further still embodiments, the detection unit 22 may instead calculate the inductance (using the equation as set out previously in the application) or directly detect the inductance of the first inductive coil S and then compare the detected inductance to a reference inductance value (i.e. the reference inductance threshold) to determine the position of the armature 16.

In further still embodiments, the timing unit may stop after a pre-determined time interval and the detection unit 22 may measure the current, voltage, rate of change of current or rate of change of voltage at the end of the time interval (i.e. the detected characteristic). The measured current, voltage, rate of change of current or rate of change of voltage may then be compared to a reference current, reference voltage, reference rate of change of current, or reference rate of change of voltage value (i.e. the reference characteristic threshold) so as to determine the position of the armature 16.

Once the position of the armature 16 is determined, the control unit 24 opens the supply switching element 30 so that the switching device 12 is ready to be used in the manner set out above to move the armature 16 as desired.

The steps outlined above are for use with a particular type of latching relay 26 as shown in the figures which includes two inductive coil windings. However, the same idea of detecting the inductance (or a characteristic thereof) of the inductive coil 14 in order to determine the position of the armature 16 can be applied to any other relay or relay like devices, such as actuators, circuit breakers etc. by implementing an inductance detection unit 22 without affecting the normal operation of the switching device 12, and also to any other device that includes an inductive coil and an armature, with the armature arranged to be moveable between first and second positions when the inductive coil is energised.

What we claim is:

1. An electrical switching assembly comprising:
   a switching device including an inductive coil, an armature, and a movable contact, the armature arranged to be moveable between first and second positions when the inductive coil is energized, and the armature being configured to permit movement of the moveable contact, the inductive coil forming part of an input circuit, and the armature, and the moveable contact forming part of an output circuit operating at higher current than the input circuit;
   a detection unit configured to detect an inductance of the inductive coil or a characteristic that corresponds to the inductance of the inductive coil, the detection unit further configured to determine a position of the armature based on the detected inductance or the detected characteristic, wherein the detection unit is configured to compare the detected inductance or detected characteristic with a single reference inductance threshold or reference characteristic threshold to determine the position of the armature; and
   a calibration unit configured to carry out a calibration of the switching device so as to determine the single reference inductance or reference characteristic threshold, wherein the single reference inductance or reference characteristic threshold is indicative of the armature being half-way between the first and second positions.

2. The electrical switching assembly according to claim 1, further including a control unit configured to selectively control a voltage across the inductive coil so as to apply a voltage step to the inductive coil, wherein the detection unit is configured to detect the inductance of the inductive coil or the characteristic that corresponds to the inductance of the inductive coil in response to the voltage step applied to the inductive coil by the control unit.

3. The electrical switching assembly according to claim 2, wherein, when the detection unit is configured to detect the characteristic that corresponds to the inductance of the inductive coil, the detection unit is configured to monitor a rate of change of current of the inductive coil when the voltage step is applied to the inductive coil.

4. The electrical switching assembly according to claim 2, wherein the control unit is configured to control the magnitude of the voltage step applied to the inductive coil so that the voltage across the inductive coil is controlled at a first value that maintains the position of the armature.

5. The electrical switching assembly according to claim 4, wherein the magnitude of the voltage step applied to the inductive coil is controlled so that the voltage across the inductive coil is controlled at a second value lower than the voltage required to move the armature between the first and second positions.

6. The electrical switching assembly according to claim 4, wherein the magnitude of the voltage step applied to the inductive coil is controlled so that the voltage across the inductive coil is controlled at a third value equal to or higher than the voltage required to move the armature between the first and second positions and wherein the control unit is configured to control the voltage across the inductive coil so as to apply the voltage step to the inductive coil for an amount of time less than the time required to move the armature between the first and second positions at the third value.

7. The electrical switching assembly according to claim 1, wherein the calibration unit is configured to determine a first reference inductance or reference characteristic threshold indicative of the armature being in the first position, and/or a second reference inductance or reference characteristic threshold indicative of the armature being in the second position.

8. The electrical switching assembly according to claim 7, wherein, when the calibration unit is configured to determine the first and second reference inductance or reference characteristic thresholds, the calibration unit is configured to determine a third reference inductance or reference characteristic threshold that is a value between the first and second reference inductance or reference characteristic thresholds, preferably wherein the third reference inductance or reference characteristic threshold is an average of the first and second reference inductance or reference characteristic thresholds.

9. The electrical switching assembly according to claim 1, wherein the single reference inductance or reference characteristic threshold is predetermined, and is stored and/or hardcoded into the switching device.

10. The electrical switching assembly according to claim 1, wherein the device is a latching relay, the latching relay being configured to selectively hold the position of the armature when the inductive coil is de-energized.

11. The electrical switching assembly according to claim 1, wherein the switching device is a non-latching relay.

12. A method of determining a position of an armature of a switching device, the switching device further including an inductive coil, an armature, and a moveable contact, the armature being arranged to be moveable between a first position and a second position when the inductive coil is energized, the armature being configured to permit movement of the moveable contact, the inductive coil forming part of an input circuit, and the armature, and the moveable contact forming part of an output circuit operating at higher current than the input circuit, the method comprising:
  i) detecting an inductance of the inductive coil or a characteristic that corresponds to the inductance of the inductive coil;
  ii) carrying out a calibration of the switching device so as to determine a single reference inductance or reference characteristic threshold, wherein the single reference inductance or reference characteristic threshold is indicative of the armature being half-way between the first and second positions; and
  iii) determining the position of the armature based on the detected inductance or the detected characteristic by comparing the detected inductance or detected characteristic with a respective single reference inductance threshold or reference characteristic threshold to determine the position of the armature.

* * * * *